(12) United States Patent
Chen et al.

(10) Patent No.: US 7,972,876 B2
(45) Date of Patent: Jul. 5, 2011

(54) ZINC-OXIDE-BASED SEMICONDUCTOR LIGHT-EMITTING DEVICE AND METHOD OF FABRICATING THE SAME

(75) Inventors: Hsing Chao Chen, Sindian (TW); Miin Jang Chen, Taipei (TW)

(73) Assignee: Miin-Jang Chen, Taipei (TW)

( * ) Notice: Subject to any disclaimer, the term of this patent is extended or adjusted under 35 U.S.C. 154(b) by 334 days.

(21) Appl. No.: 12/039,365

(22) Filed: Feb. 28, 2008

(65) Prior Publication Data

US 2008/0210973 A1    Sep. 4, 2008

(30) Foreign Application Priority Data

Mar. 2, 2007   (TW) .............................. 96107204 A
Feb. 5, 2008   (TW) .............................. 97104466 A (51) Int. Cl.
  *H01L 21/00* (2006.01)
(52) U.S. Cl. .................. 438/22; 257/E31.105
(58) Field of Classification Search ........... 257/E31.105, 257/E31.084
See application file for complete search history.

(56) References Cited

U.S. PATENT DOCUMENTS

| | | | |
|---|---|---|---|
| 7,723,154 B1 * | 5/2010 | Adekore et al. | 438/104 |
| 2007/0093004 A1 * | 4/2007 | Park et al. | 438/149 |
| 2007/0158661 A1 * | 7/2007 | Lu et al. | 257/79 |
| 2007/0186971 A1 * | 8/2007 | Lochun et al. | 136/256 |
| 2008/0191350 A1 * | 8/2008 | Ahn et al. | 257/746 |
| 2008/0193791 A1 * | 8/2008 | Ahn et al. | 428/640 |
| 2008/0308148 A1 * | 12/2008 | Leidholm et al. | 136/256 |

FOREIGN PATENT DOCUMENTS

CN        1513210 A     7/2004

OTHER PUBLICATIONS

Liu Kun; Ji Zhenguo, Review of ZnO Thin Film Growth Technology, Vacuum Science and Technology (China), Jul. 2002, 6 pages, vol.-issue No. 22/4.

* cited by examiner

*Primary Examiner* — Thao P. Le (57) ABSTRACT

The invention discloses a zinc-oxide-based semiconductor light-emitting device and the fabrication thereof. The method according to the invention, first, is to prepare a substrate. Next, by an atomic-layer-deposition-based process, a ZnO-based multi-layer structure is formed on or over the substrate where the ZnO-based multi-layer structure includes a light-emitting region.

7 Claims, 10 Drawing Sheets

ZINC-OXIDE-BASED SEMICONDUCTOR LIGHT-EMITTING DEVICE AND METHOD OF FABRICATING THE SAME

BACKGROUND OF THE INVENTION

1. Field of the Invention

The invention relates to a semiconductor light-emitting device and method of fabricating the same, and more particularly, to a ZnO-based semiconductor light-emitting device and method of fabricating the same.

2. Description of the Prior Art

Light-emitting diodes (LEDs) are semiconductor devices initially used for indicator lamps or display panels. As the emergence of white light LEDs, LEDs can also be used for illumination. Comparing with traditional light sources, LEDs have the advantages of high efficiency, long lifetime, high durability and high reliability, etc. It is renowned as revolutionary light source of the 21st century.

Zinc oxide (ZnO) is a II-VI group compound semiconductor with a direct bandgap energy of 3.37 eV at room temperature, and its emitted light is in the range of ultraviolet.

As a raw material for fabricating white light LEDs, the zinc oxide has following advantages:

1. Abundance and relatively low cost of raw materials.
2. The exciton binding energy of zinc oxide is up to 60 meV, so the light emitting efficiency is high.
3. Since the emission wavelength of zinc oxide is around 380 nm, it is more efficient in exciting fluorescent material than other materials (e.g. GaN) for fabricating white light LEDs. Therefore, the zinc oxide is very suitable for fabricating white light LEDs.
4. Zinc oxide is easier to be processed by chemical etching than other materials (e.g. GaN) for fabricating white light LEDs.

However, zinc oxide shows intrinsic n-type characteristics due to the presence of native defects, such as oxygen vacancies and zinc interstitials. Thus it suffers from the difficulty to prepare reliable and high-quality p-type zinc oxide. In order to realize a high-quality p-type zinc oxide, high-concentration p-type doping is needed to overcome the strong self-compensation effect resulting from the native n-type defects. Nevertheless, the solid solubility of p-type acceptors in zinc oxide is not high enough to achieve high p-type doping concentrations. Therefore, it is difficult to produce high-quality p-type zinc oxide, as well as the important structure of an LED, the p-n junction. As a result, a reliable growth technique is desired for the growth of high-quality zinc oxide.

Though zinc oxide is suitable for fabricating a white light LED, but owing to the limitations described above, the technology of fabricating a white light LED with zinc oxide is held up.

Accordingly, a scope of the invention is to provide a zinc-oxide-based semiconductor light-emitting device and a method of fabricating the same to solve aforesaid problems.

SUMMARY OF THE INVENTION

A scope of the invention is to provide a zinc-oxide-based semiconductor light-emitting device and a method of fabricating the same.

According to an embodiment of the invention, the method of fabricating a semiconductor light-emitting device, firstly, prepares a substrate. Then, by an atomic layer deposition based process, the method forms a ZnO-based multi-layer structure on or over the substrate, where the ZnO-based multi-layer structure includes a light-emitting region.

According to another embodiment of the invention, the semiconductor light-emitting device includes a substrate and a ZnO-based multi-layer structure formed on or over the substrate, where the ZnO-based multi-layer structure includes a light-emitting region.

Therefore, according to the invention, the method fabricates a semiconductor light-emitting device by an atomic layer deposition based process. Thereby, the method can successfully fabricate high-quality ZnO-based semiconductor light-emitting device. In addition, since the layer formed by the atomic layer deposition process has several advantages such as easy and accurate thickness control, accurate control of material composition, facile doping, abrupt interfaces, high uniformity over a large area, good reproducibility, dense and pinhole-free structures, low deposition temperatures, etc., the semiconductor light-emitting device has very high crystal quality and very low defect density.

The advantage and spirit of the invention may be understood by the following recitations together with the appended drawings.

DETAILED DESCRIPTION OF THE INVENTION

Figure 1:
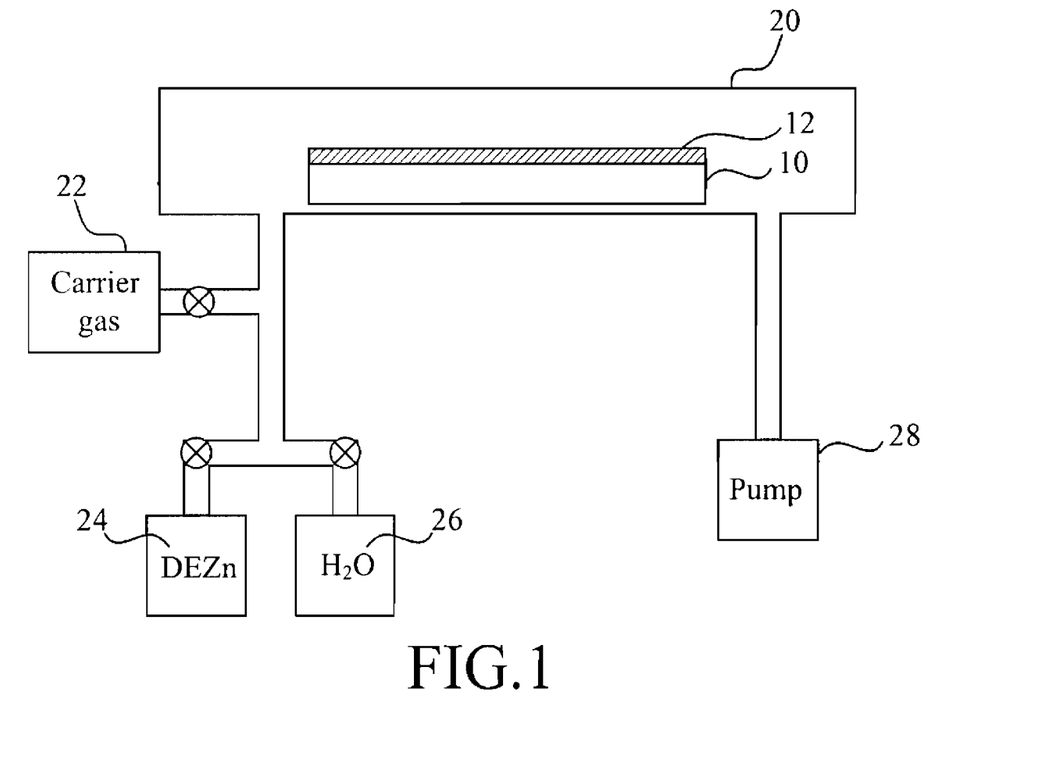
FIG. 1 shows the fabricating method according to an embodiment of the invention.

Please refer to FIG. 1. FIG. 1 shows the fabricating method according to an embodiment of the invention. According to the embodiment of the invention, the method fabricates a ZnO-based semiconductor light-emitting device by an atomic layer deposition based process. The ZnO-based semiconductor light-emitting device means that the semiconductor light-emitting device has, but not limited to, a ZnO layer, a $Mg_xZn_{1-x}O$ layer, a $Be_yZn_{1-y}O$ layer, or other compound layer with ZnO.

As shown in FIG. 1. The method, firstly, prepares a substrate 10 and set the substrate 10 in a reaction chamber 20 designed for performing an atomic layer deposition (ALD)

based process. In the embodiment, the substrate 10 can be a sapphire substrate, a Si substrate, a SiC substrate, a GaN substrate, AlGaN substrate, a InGaN substrate, a ZnO substrate, a ScAlMgO$_4$ substrate, a YSZ (yttria-stabilized zirconia) substrate, a SrCu$_2$O$_2$ substrate, a CuAlO$_2$ substrate, a LaCuOS substrate, a NiO substrate, a LiGaO$_2$ substrate, a LiAlO$_2$ substrate, a GaAs substrate, a glass substrate, or the like.

Then, by an atomic layer deposition based process, the method forms a ZnO-based multi-layer structure on or over the substrate, where the ZnO-based multi-layer structure includes a light-emitting region (not shown). In actual applications, the atomic layer deposition based process can be an atomic layer deposition process, a plasma-enhanced atomic layer deposition process, a plasma-assisted atomic layer deposition process, or combination of above processes, such as combination of the atomic layer deposition process and the plasma-enhanced atomic layer deposition process or combination of the atomic layer deposition process and the plasma-assisted atomic layer deposition process. Using the plasma-enhanced ALD process or the plasma-assisted ALD process can ionize precursors, so as to lower the deposition temperature. It is noticeable that the atomic layer deposition process is also named as Atomic Layer Epitaxy (ALE) process or Atomic Layer Chemical Vapor Deposition (ALCVD) process, so that these processes are actually the same.

In the embodiment, the light-emitting region can be a p-type doped ZnO/intrinsic ZnO/n-type doped ZnO structure combination, a p-type doped ZnO/intrinsic ZnO structure combination, a p-type doped ZnO/n-type doped ZnO structure combination, a p-type doped Mg$_x$Zn$_{1-x}$O/intrinsic Mg$_y$Zn$_{1-y}$O/n-type doped Mg$_z$Zn$_{1-z}$O structure combination, a p-type doped Mg$_x$Zn$_{1-x}$O/n-type doped Mg$_y$Zn$_{1-y}$O/n-type doped Mg$_z$Zn$_{1-z}$O structure combination, a p-type doped Mg$_x$Zn$_{1-x}$O/p-type doped Mg$_y$Zn$_{1-y}$O/n-type doped Mg$_z$Zn$_{1-z}$O structure combination, a p-type doped Mg$_x$Zn$_{1-x}$O/intrinsic ZnO/n-type doped Mg$_z$Zn$_{1-z}$O structure combination, a p-type doped Mg$_x$Zn$_{1-x}$O/n-type doped ZnO/n-type doped Mg$_z$n$_{1-z}$O structure combination, a p-type doped Mg$_x$Zn$_{1-x}$O/p-type doped ZnO/n-type doped Mg$_z$Zn$_{1-z}$O structure combination, a p-type doped Mg$_x$Zn$_{1-x}$O/n-type doped Mg$_z$Zn$_{1-z}$O structure combination, a p-type doped Mg$_x$Zn$_{1-x}$O/intrinsic Mg$_y$Zn$_{1-y}$O structure combination, a p-type doped Mg$_x$ZnO/intrinsic ZnO structure combination, a p-type doped Mg$_x$Zn$_{1-x}$O/intrinsic ZnO/n-type doped ZnO structure combination, a p-type doped Mg$_x$Zn$_{1-x}$O/p-type doped ZnO/n-type doped ZnO structure combination, a p-type doped Mg$_x$Zn$_{1-x}$O/n-type doped ZnO structure combination, a p-type doped ZnO/intrinsic ZnO/n-type doped Mg$_z$Zn$_{1-z}$O structure combination, a p-type doped ZnO/n-type doped ZnO/n-type doped Mg$_z$Zn$_{1-z}$O structure combination, a p-type doped ZnO/n-type doped Mg$_z$Zn$_{1-z}$O structure combination, an n-type doped ZnO/p-type doped the substrate structure combination, an n-type doped Mg$_z$Zn$_{1-z}$O/p-type doped the substrate structure combination, a p-type doped Be$_x$Zn$_{1-x}$O/intrinsic Be$_y$Zn$_{1-y}$O/n-type doped Be$_z$Zn$_{1-z}$O structure combination, a p-type doped Be$_x$Zn$_{1-x}$O/n-type doped Be$_y$Zn$_{1-y}$O/n-type doped Be$_z$Zn$_{1-z}$O structure combination, a p-type doped Be$_x$Zn$_{1-x}$O/p-type doped Be$_y$Zn$_{1-y}$O/n-type doped Be$_z$Zn$_{1-z}$O structure combination, a p-type doped Be$_x$Zn$_{1-x}$O/intrinsic ZnO/n-type doped Be$_z$Zn$_{1-z}$O structure combination, a p-type doped Be$_x$Zn$_{1-x}$O/n-type doped ZnO/n-type doped Be$_z$Zn$_{1-z}$O structure combination, a p-type doped Be$_x$Zn$_{1-x}$O/p-type doped ZnO/n-type doped Be$_z$Zn$_{1-z}$O structure combination, a p-type doped Be$_x$Zn$_{1-x}$O/n-type doped Be$_z$Zn$_{1-z}$O structure combination, a p-type doped Be$_x$Zn$_{1-x}$O/intrinsic Be$_y$Zn$_{1-y}$O structure combination, a p-type doped Be$_x$Zn$_{1-x}$O/intrinsic ZnO structure combination, a p-type doped Be$_x$Zn$_{1-x}$O/intrinsic ZnO/n-type doped ZnO structure combination, a p-type doped Be$_x$Zn$_{1-x}$O/p-type doped ZnO/n-type doped ZnO structure combination, a p-type doped Be$_x$Zn$_{1-x}$O/n-type doped ZnO structure combination, a p-type doped ZnO/intrinsic ZnO/n-type doped Be$_z$Zn$_{1-z}$O structure combination, a p-type doped ZnO/n-type doped ZnO/n-type doped Be$_z$Zn$_{1-z}$O structure combination, a p-type doped ZnO/n-type doped Be$_z$Zn$_{1-z}$O structure combination, an n-type doped Be$_z$Zn$_{1-z}$O/p-type doped the substrate structure combination, or the like, 0<x, y, z≦1, where the p-type doped the substrate can be the substrate 10.

The precursors of the ZnO structure can be a DEZn (diethylzinc, Zn(C$_2$H$_5$)$_2$) precursor, a DMZn (dimethylzinc, Zn(CH$_3$)$_2$) precursor, a zinc acetate (Zn(CH$_3$COO)$_2$) precursor or a ZnCl$_2$ precursor and a H$_2$O precursor, an O$_3$ precursor, an O$_2$ precursor, or an oxygen radical. The DEZn, the DMZn, the zinc acetate or the ZnCl$_2$ is the source of the Zn, and the H$_2$O, the O$_3$, the O$_2$, or the oxygen radical is the source of the O. The precursors of the Mg$_x$Zn$_{1-x}$O structure can be a DEZn precursor, a DMZn precursor, a zinc acetate precursor or a ZnCl$_2$ precursor, a MgCp$_2$ (Bis(cyclopentadienyl)magnesium, Mg(C$_5$H$_5$)$_2$) precursor, a Mg(thd)$_2$ (2,2,6,6-tetramethyl-heptanedionato-3,5-magnesium(II)) precursor or a Bis(pentamethylcyclopentadienyl)magnesium (C$_{20}$H$_{30}$Mg) precursor and a H$_2$O precursor, an O$_3$ precursor, an O$_2$ precursor, or an oxygen radical. The DEZn, the DMZn, the zinc acetate or the ZnCl$_2$ is the source of the Zn; the MgCp$_2$, the Mg(thd)$_2$ or the Bis(pentamethylcyclopentadienyl)magnesium is the source of the Mg; and the H$_2$O, the O$_3$, the O$_2$, or the oxygen radical is the source of the O.

The precursors of the Be$_x$Zn$_{1-x}$O structure can be a DEZn precursor, a DMZn precursor, a zinc acetate precursor or a ZnCl$_2$ precursor, a Be(acac)$_3$(beryllium acetylacetonate, (CH$_3$COCH=C(O—)CH$_3$)$_2$Be) precursor or a BeCl$_2$ precursor and a H$_2$O precursor, an O$_3$ precursor, an O$_2$ precursor, or an oxygen radical. The DEZn, the DMZn, the zinc acetate or the ZnCl$_2$ is the source of the Zn; the Be(acac)$_3$ or the BeCl$_2$ is the source of the Be; and the H$_2$O, the O$_3$, the O$_2$, or the oxygen radical is the source of the O.

In the embodiment, the method of fabricating the p-type doped ZnO includes adding a p-type dopant during the atomic layer deposition process, where the p-type dopant can be nitrogen, phosphorous, arsenic, etc. The precursor of nitrogen as the p-type dopant is, preferable but not limited to, a NH$_3$ precursor, a NO precursor, a N$_2$O precursor, an 1,1-Dimethylhydrazine ((CH$_3$)$_2$NNH$_2$) precursor, a Tert-butylamine ((CH$_3$)$_3$CNH$_2$), or a Tert-butyl hydrazine ((CH$_3$)$_3$CNHNH$_2$) precursor. The precursor of phosphorous as the p-type dopant is, preferable but not limited to, a PH$_3$ precursor, a P$_2$O$_5$ precursor, a Zn$_3$P$_2$ precursor, or a Diethyl phosphite ((C$_2$H$_5$O)$_2$P(O)H). The precursor of arsenic as the p-type dopant is, preferable but not limited to, an AsH$_3$ precursor.

In the embodiment, the method of fabricating the n-type doped ZnO includes adding an n-type dopant during the atomic layer deposition process, where the n-type dopant can be aluminum, gallium, indium, etc. The precursor of aluminum as the n-type dopant is, preferable but not limited to, a Trimethylaluminum (Al(CH$_3$)$_3$) precursor or a Triethylaluminum (Al(C$_2$H$_5$)$_3$) precursor. The precursor of gallium as the n-type dopant is, preferable but not limited to, a Trimethylgallium (Ga(CH$_3$)$_3$) precursor or a Triethylgallium (Ga(C$_2$H$_5$)$_3$) precursor. The precursor of indium as the n-type dopant is, preferable but not limited to, a Indium acetylacetonate (In(OCCH$_3$CHOCCH$_3$)$_3$) precursor or a Trimethylindium (In(CH$_3$)$_3$) precursor.

As shown in FIG. 1, an example of forming a ZnO layer by an atomic layer deposition process is presented. In an embodiment, an atomic layer deposition cycle (ALD cycle) includes four reaction steps of:

1. Using a carrier gas 22 to carry DEZn molecules 24 into the reaction chamber 20; thereby, the DEZn molecules 24 are absorbed on the surface of the substrate 10 to form a layer of DEZn.

2. Using the carrier gas 22, with assistance of the pump 28, to purge the DEZn molecules which are not absorbed on the surface of the substrate 10.

3. Using the carrier gas 22 to carry $H_2O$ molecules 26 into the reaction chamber 20; thereby, the $H_2O$ molecules 26 react with the DEZn radicals absorbed on the surface of the substrate 10 to form one monolayer of ZnO, where by-product are organic molecules.

4. Using the carrier gas 22, with assistance of the pump 28, to purge the residual $H_2O$ molecules 26 and the by-product due to the reaction.

In the embodiment, the carrier gas 22 can be highly pure argon gas or nitrogen gas. The above four steps is called an ALD cycle. An ALD cycle grows a thin film with a thickness of only one monolayer on the entire surface of the substrate 10; the characteristic is named as "self-limiting", and the characteristic allows the precision of the thickness control of the atomic layer deposition to be one monolayer. Therefore, the thickness of the ZnO layer can be precisely controlled by the number of ALD cycles.

In practice, during the process of fabricating an n-type doped ZnO or a p-type doped ZnO, the doping is implemented by replacing partial ALD cycles with the ALD cycles of n-type dopant or p-type dopant, and the doping concentration is determined by the proportion of the replaced ALD cycles. Take an n-type doped ZnO with 6% Al for example, 3 of 50 ALD cycles of DEZn and $H_2O$ are replaced by 3 ALD cycles of TMA and $H_2O$, or 6 of 100 ALD cycles of DEZn and $H_2O$ are replaced by 6 ALD cycles of TMA and $H_2O$, etc.

In the embodiment, the deposition temperature is in a range of from room temperature to 800° C. However, the deposition temperature is preferably in a range of from 100° C. to 300° C. It is noticeable that since the deposition temperature is relatively low, the damage and/or malfunction probability of equipment owing to high temperature can be reduced, and the reliability of the process and the equipment availability are further enhanced.

In order to further decrease the defect density and improve the crystal quality, any structure of the p-type doped ZnO/intrinsic ZnO/n-type doped ZnO structure combination, the p-type doped ZnO/intrinsic ZnO structure combination, the p-type doped ZnO/n-type doped ZnO structure combination, the p-type doped $Mg_xZn_{1-x}O$/intrinsic $Mg_yZn_{1-y}O$/n-type doped $Mg_zZn_{1-z}O$ structure combination, the p-type doped $Mg_xZn_{1-x}O$/n-type doped $Mg_yZn_{1-y}O$/n-type doped $Mg_zZn_{1-z}$ O structure combination, the p-type doped $Mg_xZn_{1-x}$ O/p-type doped $Mg_yZn_{1-y}O$/n-type doped $Mg_zZn_{1-z}$ O structure combination, the p-type doped $Mg_xZn_{1-x}O$/intrinsic ZnO/n-type doped $Mg_zZn_{1-z}O$ structure combination, the p-type doped $Mg_xZn_{1-x}O$/n-type doped ZnO/n-type doped $Mg_zZn_{1-z}O$ structure combination, the p-type doped $Mg_xZn_{1-x}O$/p-type doped ZnO/n-type doped $Mg_zZn_{1-z}O$ structure combination, the p-type doped $Mg_xZn_{1-x}$ O/n-type doped $Mg_zZn_{1-z}O$ structure combination, the p-type doped $Mg_xZn_{1-x}O$/intrinsic $Mg_yZn_{1-y}O$ structure combination, the p-type doped $Mg_xZn_{1-x}O$/intrinsic ZnO structure combination, the p-type doped $Mg_xZn_{1-x}O$/intrinsic ZnO/n-type doped ZnO structure combination, the p-type doped $Mg_xZn_{1-x}O$/p-type doped ZnO/n-type doped ZnO structure combination, the p-type doped $Mg_xZn_{1-x}O$/n-type doped ZnO structure combination, the p-type doped ZnO/intrinsic ZnO/n-type doped $Mg_zZn_{1-z}$ O structure combination, the p-type doped ZnO/n-type doped ZnO/n-type doped $Mg_zZn_{1-z}O$ structure combination, the p-type doped ZnO/n-type doped $Mg_zZn_{1-z}O$ structure combination, the n-type doped ZnO/p-type doped the substrate structure combination, the n-type doped $Mg_zZn_{1-z}O$/p-type doped the substrate structure combination, the p-type doped $Be_xZn_{1-x}O$/intrinsic $Be_yZn_{1-y}O$/n-type doped $Be_zZn_{1-z}O$ structure combination, the p-type doped $Be_xZn_{1-x}O$/n-type doped $Be_yZn_{1-y}O$/n-type doped $Be_zZn_{1-z}O$ structure combination, the p-type doped $Be_xZn_{1-x}O$/p-type doped $Be_yZn_{1-y}O$/n-type doped $Be_zZn_{1-z}O$ structure combination, the p-type doped $Be_xZn_{1-x}O$/intrinsic ZnO/n-type doped $Be_zZn_{1-z}O$ structure combination, the p-type doped $Be_xZn_{1-x}O$/n-type doped ZnO/n-type doped $Be_zZn_{1-z}O$ structure combination, the p-type doped $Be_xZn_{1-x}O$/p-type doped ZnO/n-type doped $Be_zZn_{1-z}O$ structure combination, the p-type doped $Be_xZn_{1-x}$ O/n-type doped $Be_zZn_{1-z}O$ structure combination, the p-type doped $Be_xZn_{1-x}O$/intrinsic $Be_yZn_{1-y}O$ structure combination, the p-type doped $Be_xZn_{1-x}O$/intrinsic ZnO structure combination, the p-type doped $Be_xZn_{1-x}O$/intrinsic ZnO/n-type doped ZnO structure combination, the p-type doped $Be_xZn_{1-x}$ O/p-type doped ZnO/n-type doped ZnO structure combination, the p-type doped $Be_xZn_{1-x}O$/n-type doped ZnO structure combination, the p-type doped ZnO/intrinsic ZnO/n-type doped $Be_zZn_{1-z}O$ structure combination, the p-type doped ZnO/n-type doped ZnO/n-type doped $Be_zZn_{1-z}O$ structure combination, the p-type doped ZnO/n-type doped $Be_zZn_{1-z}O$ structure combination, and the n-type doped $Be_zZn_{1-z}O$/p-type doped the substrate structure combination can be further annealed at a temperature ranging from 400° C. to 1200° C. after deposition, and the atmosphere can be nitrogen, oxygen, argon, or mixture of nitrogen, oxygen and argon.

The atomic layer deposition based process can offer following advantages:

1. Low deposition temperatures.
2. Precise thickness control, to the degree of one monolayer.
3. Accurate control of material composition.
4. Facile doping to achieve high doping concentrations.
5. High-quality epitaxial layer with low defect density
6. Abrupt interface and excellent interface quality for growth of high quality heterojunctions, multiple quantum wells and so on.
7. Large-area and large-batch capacity.
8. High uniformity.
9. Excellent conformality and good step coverage.
10. Good reproducibility.

Figure 2:
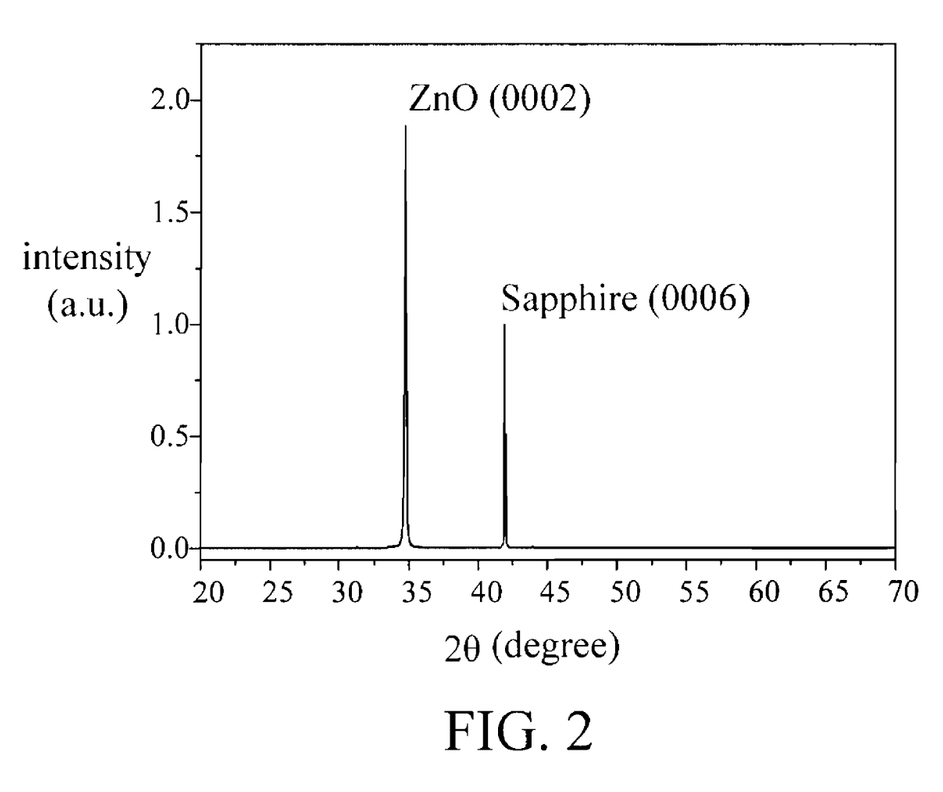
FIG. 2 shows the X-ray diffraction pattern of the ZnO layer grown on a sapphire substrate by an atomic layer deposition process.

Please refer to FIG. 2. FIG. 2 shows the X-ray diffraction pattern of the ZnO layer grown on a sapphire substrate by an atomic layer deposition process. As shown in FIG. 2, the ZnO layer formed by the atomic layer deposition process has excellent crystal quality.

Figure 3:
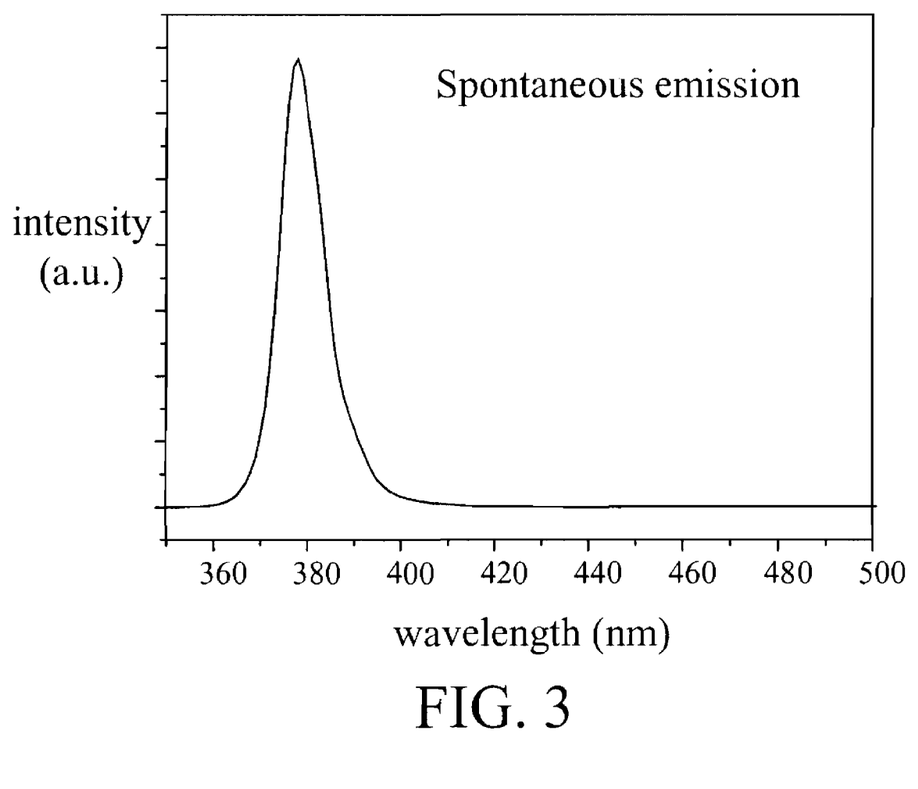
FIG. 3 shows the spontaneous emission photoluminescence spectrum of the ZnO layer grown on a sapphire substrate by an atomic layer deposition process.
Figure 4:
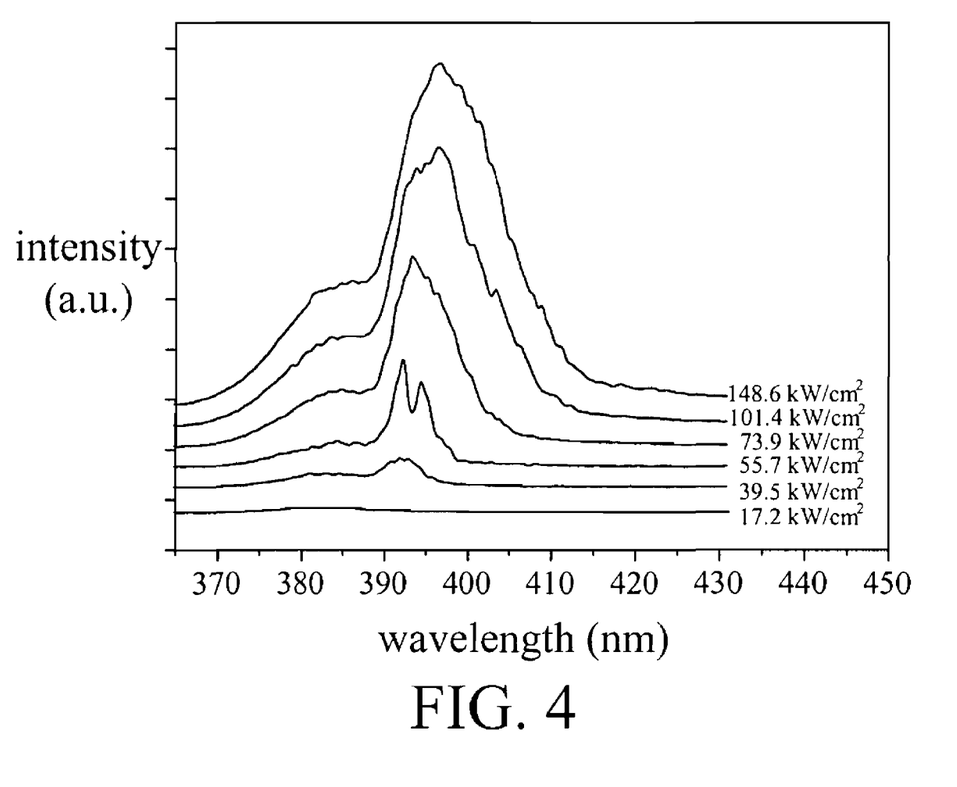
FIG. 4 shows the stimulated emission photoluminescence spectra of the ZnO layer grown on a sapphire substrate by an atomic layer deposition process.
Figure 5:
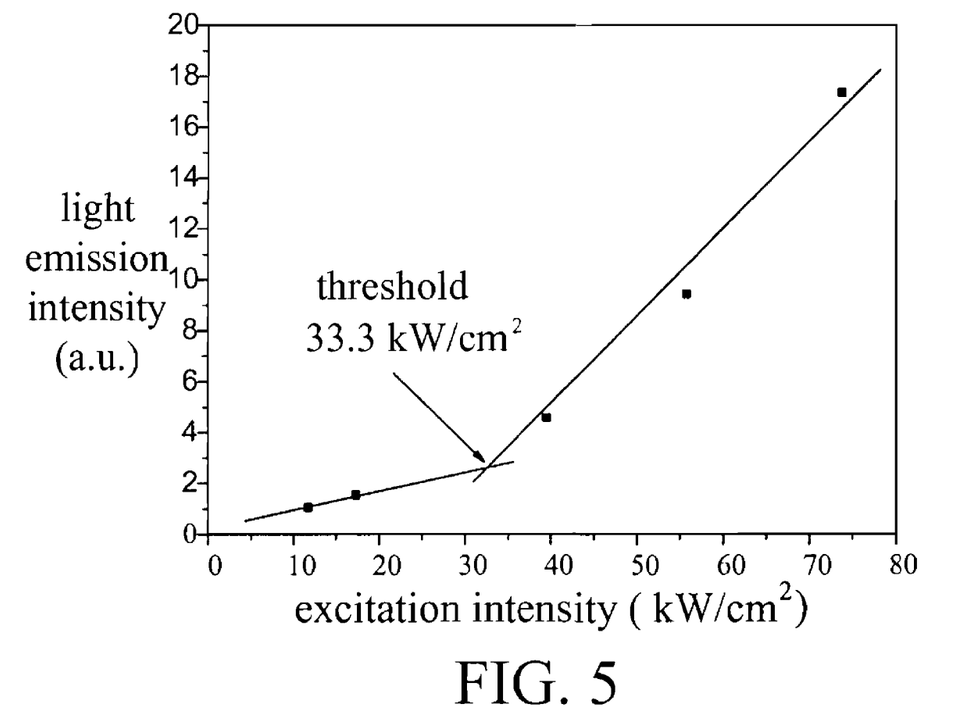
FIG. 5 shows the relationship between the photoluminescence light emission intensity and the excitation intensity of the ZnO layer grown on a sapphire substrate by an atomic layer deposition process.

Please refer to FIG. 3 through FIG. 5. FIG. 3 shows the spontaneous emission photoluminescence spectrum at room temperature of the ZnO layer grown on a sapphire substrate by an atomic layer deposition process. FIG. 4 shows the stimulated emission photoluminescence spectra of the ZnO layer grown on a sapphire substrate by an atomic layer deposition process. FIG. 5 shows the relationship between the photoluminescence light emission intensity and the excitation intensity of the ZnO layer grown on a sapphire substrate by an atomic layer deposition process. FIG. 5 shows that the light emission intensity increases super-linearly with the excitation intensity, indicating that the stimulated emission occurs at a low threshold intensity of 33.3 kW/cm². The occurrence of stimulated emission indicates that the ZnO layer grown by the atomic layer deposition process has very high crystal quality and very low defect density. This shows, since the atomic layer deposition process offers the advantages such as easy and accurate thickness control, accurate control of material composition, facile doping, abrupt interfaces, high uniformity over a large area, good reproducibility, dense and pinhole-free structures, low deposition temperatures, etc., the semiconductor light-emitting device fabricated by the atomic layer deposition process has very high crystal quality and very low defect density. Besides, the semiconductor light-emitting device can probably induce lasing phenomenon, so the semiconductor light-emitting device can be more extensively utilized.

Figure 6:
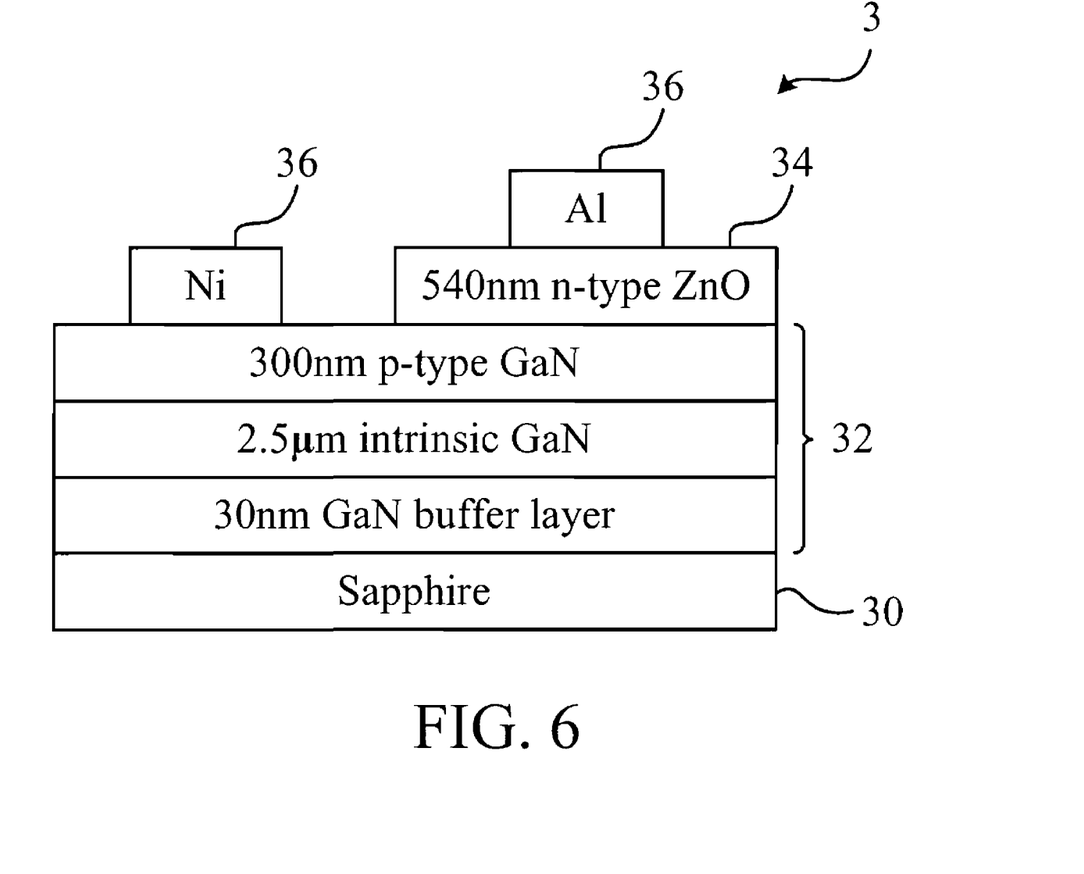
FIG. 6 shows a semiconductor light-emitting device according to an embodiment of the invention.

Please refer to FIG. 6. FIG. 6 shows a semiconductor light-emitting device 3 according to an embodiment of the invention. In the embodiment, the semiconductor light-emitting device 3 is a light-emitting diode fabricated by an atomic layer deposition based process. In actual applications, the atomic layer deposition based process can be an atomic layer deposition process, a plasma-enhanced atomic layer deposition process, a plasma-assisted atomic layer deposition process, or combination of above processes. As shown in FIG. 6, the semiconductor light-emitting device 3 includes a substrate 30, a GaN layer 32, a ZnO layer 34, and electrodes 36. In the embodiment, the substrate 30 is a sapphire substrate. In practice, the GaN layer 32 can be a GaN structure grown on the substrate 30 by a metal organic chemical vapor deposition (MOCVD) process. The ZnO layer 34 can be an intrinsic n-type ZnO layer grown on the GaN layer 32 by the atomic layer deposition process. After annealed at the temperature of 950° C. in the nitrogen atmosphere for five minutes, and then deposited with the electrodes 36 by an evaporator, an n-type ZnO/p-type GaN heterojunction light-emitting diode is finished as the semiconductor light-emitting device 3, as shown in FIG. 6.

Figure 7:
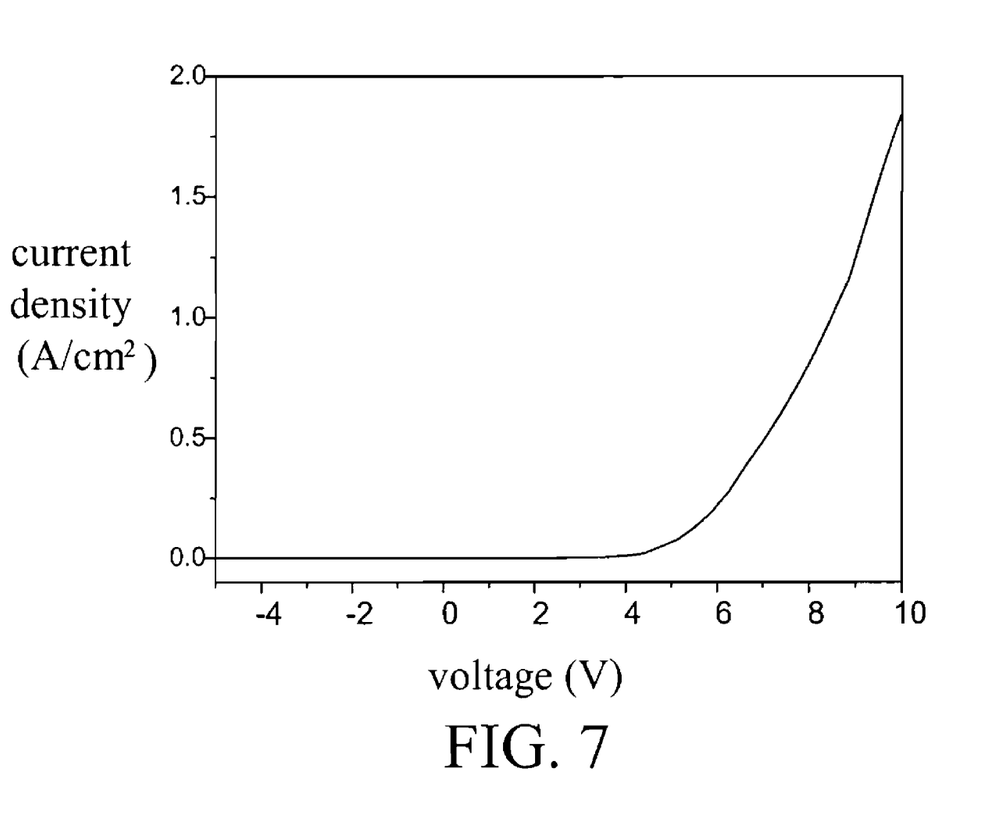
FIG. 7 shows the current density vs. voltage characteristics of the semiconductor light-emitting device shown in FIG. 6.
Figure 8:
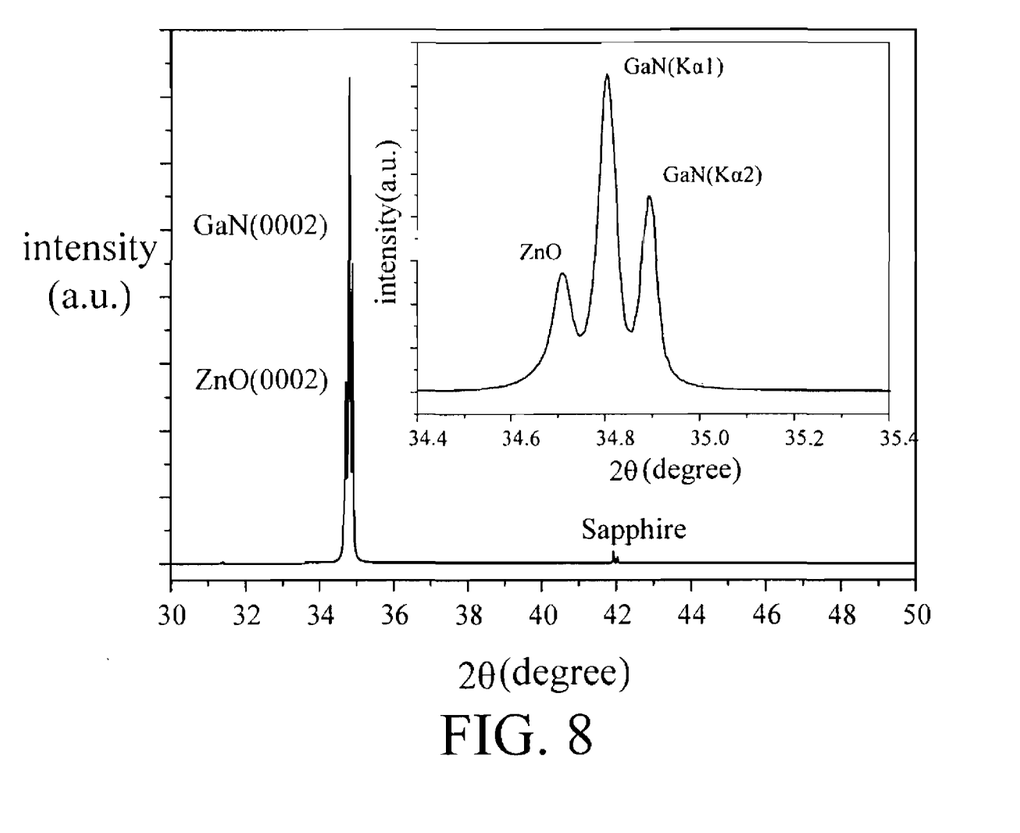
FIG. 8 shows the X-ray diffraction patterns of the ZnO layer and the GaN layer of the semiconductor light-emitting device shown in FIG. 6.
Figure 9:
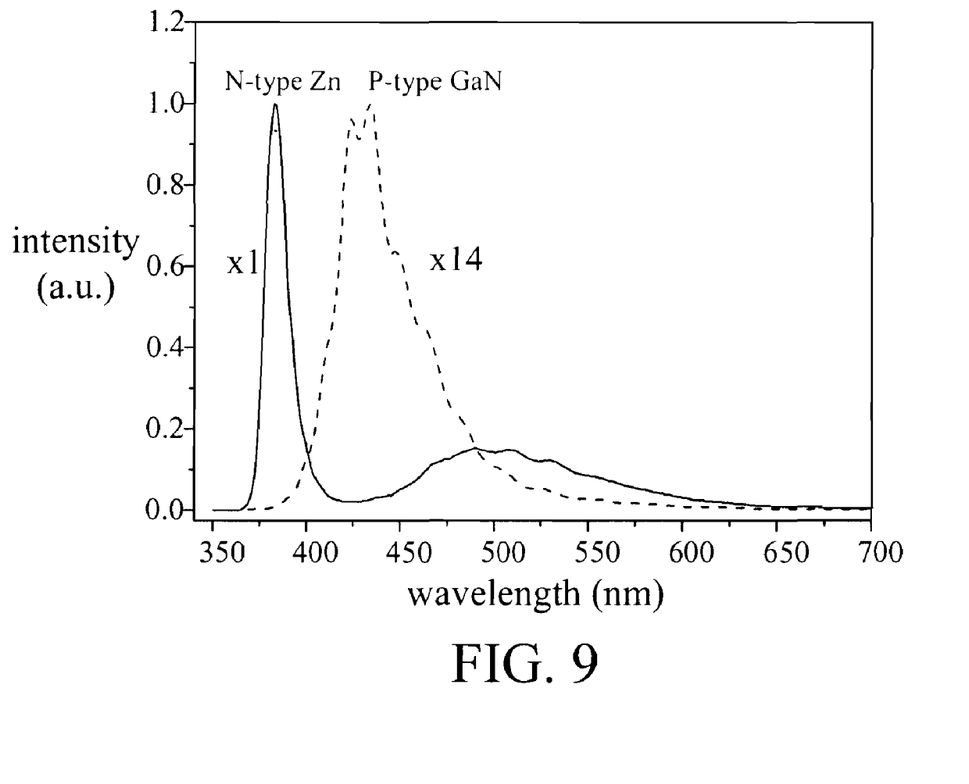
FIG. 9 shows the photoluminescence spectra of the ZnO layer and the GaN layer of the semiconductor light-emitting device shown in FIG. 6.
Figure 10:
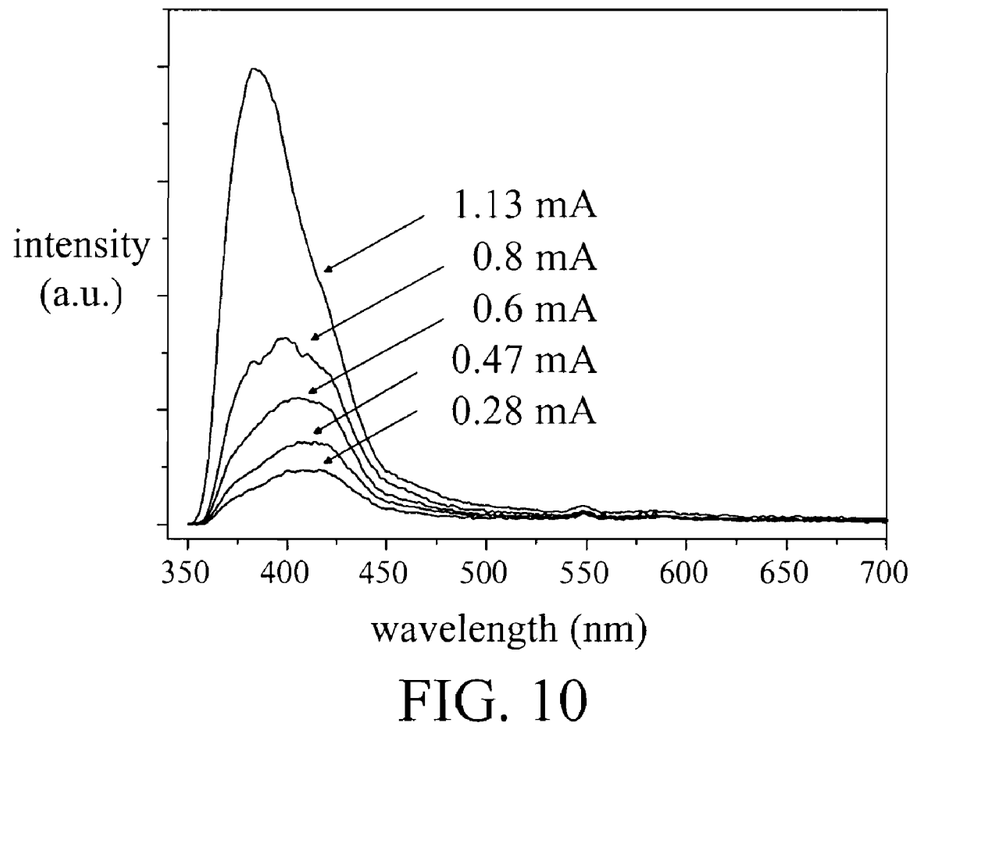
FIG. 10 shows the electroluminescence spectra of the semiconductor light-emitting device shown in FIG. 6 at various injection currents.

Please refer to FIG. 7. FIG. 7 shows the current density vs. voltage characteristics of the semiconductor light-emitting device 3 shown in FIG. 6. From FIG. 7, we can see that the semiconductor light-emitting device 3 shows a rectifying characteristic. Please refer to FIG. 8. FIG. 8 shows the X-ray diffraction patterns of the ZnO layer 34 and the GaN layer 32 of the semiconductor light-emitting device 3 shown in FIG. 6. As shown in FIG. 8, the full-width at half-maximum (FWHM) of the ZnO (0002) Kα1 peak and GaN (0002) Kα1 peak are 0.05° and 0.04°, respectively, suggesting that the crystal quality of the ZnO layer 34 is good and comparable to that of GaN. Please refer to FIG. 9 and FIG. 10. FIG. 9 shows the photoluminescence spectra of the ZnO layer 34 and the GaN layer 32 of the semiconductor light-emitting device 3 shown in FIG. 6. FIG. 10 shows the electroluminescence spectra of the semiconductor light-emitting device 3 shown in FIG. 6 at various injection currents. Comparing FIG. 9 with FIG. 10, it can be found that as the injection current is low, electroluminescence originates mainly from the GaN layer 32; as the injection current increases, the light emission from the ZnO layer 34 dominates over that from the GaN layer 32. Accordingly, it is demonstrated that the ZnO-based semiconductor light-emitting device has good light-emitting performance due to the excellent light-emitting characteristics of ZnO.

Comparing with prior art, the method according to the invention fabricates a semiconductor light-emitting device by an atomic layer deposition process. Thereby, the method can successfully fabricate high-quality ZnO-based semiconductor light-emitting devices. In addition, since the layer formed by the atomic layer deposition process has several advantages such as easy and accurate thickness control, accurate control of material composition, facile doping, abrupt interfaces, high uniformity over a large area, good reproducibility, dense and pinhole-free structures, low deposition temperatures, etc., the semiconductor light-emitting device has very high crystal quality and very low defect density. Moreover, by the atomic layer deposition process, the semiconductor light-emitting device can be fabricated on large area so as to be more productive, and makes the associated product move competent. Furthermore, since the deposition temperature is relatively low, the damage and/or malfunction probability of equipment owing to high temperature can be reduced, and the reliability of the process and the equipment availability are further enhanced.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of fabricating a semiconductor light-emitting device, comprising the steps of:
preparing a substrate; and
by an atomic layer deposition process, forming a ZnO-based multi-layer structure on or over the substrate, the ZnO-based multi-layer structure comprising a light-emitting region, wherein the light-emitting region is one selected from a group consisting of a p-type doped ZnO/intrinsic ZnO/n-type doped ZnO structure combination, a p-type doped ZnO/intrinsic ZnO structure combination, a p-type doped ZnO/n-type doped ZnO structure combination, a p-type doped $Mg_xZn_{1-x}O$/intrinsic $Mg_yZn_{1-y}O$/n-type doped $Mg_zZn_{1-z}O$ structure combination, a p-type doped $Mg_xZn_{1-x}O$/n-type doped $Mg_yZn_{1-y}O$/n-type doped $Mg_zZn_{1-z}O$ structure combination, a p-type doped $Mg_xZn_{1-x}O$/p-type doped $Mg_yZn_{1-y}O$/n-type doped $Mg_zZn_{1-z}O$ structure combination, a p-type doped $Mg_xZn_{1-x}O$/intrinsic ZnO/n-type doped $Mg_zZn_{1-z}O$ structure combination, a p-type doped $Mg_xZn_{1-x}O$/n-type doped ZnO/n-type doped $Mg_zZn_{1-z}O$ structure combination, a p-type doped $Mg_xZn_{1-x}O$/p-type doped ZnO/n-type doped $Mg_zZn_{1-z}O$ structure combination, a p-type doped $Mg_xZn_{1-x}O$/n-type doped $Mg_zZn_{1-z}O$ structure combination, a p-type doped $Mg_xZn_{1-x}O$/intrinsic $Mg_yZn_{1-y}O$ structure combination, a p-type doped $Mg_xZn_{1-x}O$/intrinsic ZnO structure combination, a p-type doped $Mg_xZn_{1-x}O$/intrinsic ZnO/n-type doped ZnO structure combination, a p-type doped $Mg_xZn_{1-x}O$/p-type doped ZnO/n-type doped ZnO structure combination, a p-type doped $Mg_xZn_{1-x}O$/n-type doped ZnO structure combination, a p-type doped ZnO/intrinsic ZnO/n-type doped $Mg_zZn_{1-z}O$ structure combination, a p-type doped ZnO/n-type doped ZnO/n-type doped $Mg_zZn_{1-z}O$ structure combination, a p-type doped ZnO/n-type doped $Mg_zZn_{1-z}O$ structure combination, an n-type doped ZnO/p-type doped the substrate structure combination, an n-type doped $Mg_zZn_{1-z}O$/p-type doped the substrate structure combination, a p-type doped $Be_xZn_{1-x}O$/intrinsic $Be_yZn_{1-y}O$/n-type doped $Be_zZn_{1-z}O$ structure combination, a p-type doped $Be_xZn_{1-x}O$/n-type doped $Be_yZn_{1-y}O$/n-type doped $Be_zZn_{1-z}O$ structure combination, a p-type doped $Be_xZn_{1-x}O$/p-type doped $Be_yZn_{1-y}O$/n-type doped $Be_zZn_{1-z}O$ structure combination, a p-type doped $Be_xZn_{1-x}O$/intrinsic ZnO/n-type doped $Be_zZn_{1-z}O$ structure combination, a p-type doped $Be_xZn_{1-x}O$/n-type doped ZnO/n-type doped $Be_zZn_{1-z}O$ structure combination, a p-type doped $Be_xZn_{1-x}O$/p-type doped ZnO/n-type doped $Be_zZn_{1-z}O$ structure combination, a p-type doped $Be_xZn_{1-x}O$/n-type doped $Be_zZn_{1-z}O$ structure combination, a p-type doped $Be_xZn_{1-x}O$/intrinsic $Be_yZn_{1-y}O$ structure combination, a p-type doped $Be_xZn_{1-x}O$/intrinsic ZnO structure combination, a p-type doped $Be_xZn_{1-x}O$/intrinsic ZnO/n-type doped ZnO structure combination, a p-type doped $Be_xZn_{1-x}O$/p-type doped ZnO/n-type doped ZnO structure combination, a p-type doped $Be_xZn_{1-x}O$/n-type doped ZnO structure combination, a p-type doped ZnO/intrinsic ZnO/n-type doped $Be_zZn_{1-z}O$ structure combination, a p-type doped ZnO/n-type doped ZnO/n-type doped $Be_zZn_{1-z}O$ structure combination, a p-type doped ZnO/n-type doped $Be_zZn_{1-z}O$ structure combination, and an n-type doped $Be_zZn_{1-z}O$/p-type doped the substrate structure combination, $0<x, y, z \leq 1$; wherein each layer of ZnO-based multi-layer structure is deposited in one monolayer way per deposition cycle, the ZnO-based multi-layer is doped during deposition by the atomic layer deposition process performing at the deposition temperature ranging from 100° C. to 500° C., said atomic layer deposition process is different from an MOVPE (metalogranic vapor phase epitaxy) process or an MBE (molecular beam epitaxy) process.

2. The method of claim 1, wherein the light-emitting region is further annealed at a temperature ranging from 800° C. to 1200° C. after deposition.

3. The method of claim 1, wherein the precursors of the ZnO structure are a DEZn (diethylzinc, $Zn(C_2H_5)_2$) precursor, a DMZn (dimethylzinc, $Zn(CH_3)_2$) precursor, a zinc acetate ($Zn(CH_3COO)_2$) precursor, or a $ZnCl_2$ precursor and a $H_2O$ precursor, an $O_3$ precursor, an $O_2$ precursor, or an oxygen radical.

4. The method of claim 1, wherein the precursors of the $Mg_xZn_{1-x}O$ structure are a DEZn precursor, a DMZn precursor, a zinc acetate precursor, or a $ZnCl_2$ precursor, a $MgCp_2$ (Bis(cyclopentadienyl)magnesium, $Mg(C_5H_5)_2$) precursor, a $Mg(thd)_2$ (2,2,6,6-tetramethyl-heptanedionato-3,5-magnesium(II)) precursor or a Bis(pentamethylcyclopentadienyl)magnesium ($C_{20}H_{30}Mg$) precursor and a $H_2O$ precursor, an $O_3$ precursor, an $O_2$ precursor, or an oxygen radical.

5. The method of claim 1, wherein the precursors of the $Be_xZn_{1-x}O$ structure are a DEZn precursor, a DMZn precursor, a zinc acetate precursor, or a $ZnCl_2$ precursor, a $Be(acac)_3$ (beryllium acetylacetonate, $(CH_3COCH=C(O-)CH_3)_2Be$) precursor or a $BeCl_2$ precursor and a $H_2O$ precursor, an $O_3$ precursor, an $O_2$ precursor, or an oxygen radical.

6. The method of claim 1, wherein a p-type dopant doped in the p-type structures is one selected from the group consisting of nitrogen, phosphorous and arsenic, the precursor of nitrogen as the p-type dopant is a $NH_3$ precursor, a NO precursor, a $N_2O$ precursor, an 1,1-Dimethylhydrazine ($(CH_3)_2NNH_2$) precursor, a Tert-butylamine ($(CH_3)_3CNH_2$), or a Tert-butyl hydrazine ($(CH_3)_3CNHNH_2$) precursor, the precursor of phosphorous as the p-type dopant is a $PH_3$ precursor, a $P_2O_5$ precursor, a $Zn_3P_2$ precursor, or a Diethyl phosphite ($(C_2H_5O)_2P(O)H$), the precursor of arsenic as the p-type dopant is a $AsH_3$ precursor.

7. The method of claim 1, wherein an n-type dopant doped in the n-type structures is one selected from the group consisting of aluminum, gallium and indium, the precursor of aluminum as the n-type dopant is a Trimethylaluminum (Al$(CH_3)_3$) precursor or a Triethylaluminum (Al$(C_2H_5)_3$) precursor, the precursor of gallium as the n-type dopant is a Trimethylgallium (Ga$(CH_3)_3$) precursor or a Triethylgallium (Ga$(C_2H_5)_3$) precursor, the precursor of indium as the n-type dopant is an Indium acetylacetonate (In$(OCCH_3CHOCCH_3)_3$) precursor or a Trimethylindium (In$(CH_3)_3$) precursor.

* * * * *